United States Patent
Mani et al.

(10) Patent No.: US 9,985,660 B2
(45) Date of Patent: May 29, 2018

(54) MEDIA CONTROLLER

(71) Applicant: Imagination Technologies Limited, Kings Langley (GB)

(72) Inventors: Senthil Kumar Mani, Hyderabad (IN); Bala Manikya Prasad Puram, Hyderabad (IN); Harish Rajamani, Hyderabad (IN)

(73) Assignee: Imagination Technologies Limited, Kings Langley (GB)

( * ) Notice: Subject to any disclaimer, the term of this patent is extended or adjusted under 35 U.S.C. 154(b) by 417 days.

(21) Appl. No.: 14/703,479

(22) Filed: May 4, 2015

(65) Prior Publication Data
US 2015/0319212 A1 Nov. 5, 2015

(30) Foreign Application Priority Data
May 2, 2014 (GB) .................... 1407782.0

(51) Int. Cl.
*H04L 12/26* (2006.01)
*H03M 13/35* (2006.01)
(Continued)

(52) U.S. Cl.
CPC .......... *H03M 13/353* (2013.01); *G06F 11/10* (2013.01); *H04L 43/087* (2013.01);
(Continued)

(58) Field of Classification Search
CPC . H04J 1/16; H04W 52/02; H04M 1/64; H04L 7/00
See application file for complete search history.

(56) References Cited

U.S. PATENT DOCUMENTS 6,580,694 B1 * 6/2003 Baker ............... H04L 47/18 370/252
8,279,884 B1 * 10/2012 Narasimha ......... H04L 47/22 370/410

(Continued)

FOREIGN PATENT DOCUMENTS

| WO | 9522233 A1 | 8/1995 |
|---|---|---|
| WO | 03029990 A1 | 4/2003 |
| WO | 2011163042 A2 | 12/2011 |

OTHER PUBLICATIONS

Wu "An Improved Statistical Ana lysis Method for Duty Cycle Distortion Jitter Analysis", 17th International Symposium on Consumer Electronics, 2013.

(Continued)

*Primary Examiner* — Andrew Lai
*Assistant Examiner* — Chuong M Nguyen
(74) *Attorney, Agent, or Firm* — Vorys, Sater, Seymour and Pease LLP; Vincent M DeLuca (57) ABSTRACT

A data processing device comprising: a jitter buffer for receiving data packets; a media decoder configured to decode the data packets so as to form a stream of media frames, each frame comprising a plurality of samples; a media consumer having an input buffer for receiving the stream of media frames and being configured to play media frames from the input buffer according to a first frame rate; a buffer interface configured to monitor the input buffer so as to detect when the number of samples at the input buffer of the media consumer falls below a predetermined level and, in response, generate a play-out request; and a media controller configured to, responsive to each of the generated play-out requests, play-out one or more data packets to the (Continued)

media decoder so as to cause media frames of the stream to be delivered into the input buffer at a rate commensurate with the first frame rate.

20 Claims, 3 Drawing Sheets

(51) Int. Cl.
| | |
|---|---|
| *H04L 29/06* | (2006.01) |
| *H04L 12/863* | (2013.01) |
| *H04M 7/00* | (2006.01) |
| *G06F 11/10* | (2006.01) |
| *H04L 12/841* | (2013.01) |
| *H04L 12/801* | (2013.01) |

(52) U.S. Cl.
CPC .......... *H04L 43/106* (2013.01); *H04L 47/283* (2013.01); *H04L 47/34* (2013.01); *H04L 47/626* (2013.01); *H04L 65/602* (2013.01); *H04L 65/604* (2013.01); *H04L 65/608* (2013.01); *H04M 7/0084* (2013.01)

(56) References Cited

U.S. PATENT DOCUMENTS

| | | | | |
|---|---|---|---|---|
| 8,937,963 | B1* | 1/2015 | Narasimha | H04L 47/22 370/410 |
| 2002/0101885 | A1* | 8/2002 | Pogrebinsky | H04J 3/0632 370/516 |
| 2003/0091160 | A1* | 5/2003 | Enbom | H04L 12/6418 379/67.1 |
| 2003/0112758 | A1* | 6/2003 | Pang | G06F 15/7842 370/235 |
| 2004/0057445 | A1* | 3/2004 | LeBlanc | H04J 3/0632 370/412 |
| 2005/0207437 | A1* | 9/2005 | Spitzer | H04L 12/66 370/412 |
| 2009/0016333 | A1* | 1/2009 | Wang | H04L 65/80 370/389 |
| 2010/0034332 | A1* | 2/2010 | Enstrom | H04L 47/2483 375/371 |
| 2016/0078876 | A1* | 3/2016 | Kirla | H04L 47/26 704/501 |

OTHER PUBLICATIONS

Lopez et al. "Applying traditional VoIP playout delay control algorithms to MANETs", International Caribbean Conference on Devices, Circuts and Systems, 2012.

Hines et al. "Detailed Comparative Analysis of PESQ and VISQOL Behaviour in the Context of Play Out Delay Adjustment introduced by VoIP Jitter Buffer Algorithms", International Workshop on Quality of Multimedia Experience, 2013.

Kovac et al. "E-Model MOS Estimate Precision Improvement and Modelling of Jitter Effects", Information and Communication Technologies and Services, vol. 10, 2012.

Chu et al. "End-to-End Performance and Reliability Estimation of PacketCable VoIP Services".

Kim et al. "Enhancing VoIP Speech Quality Using Combined Playout Control and Signal Reconstruction" IEEE Transactions on Consumer Electronics, vol. 58, No. 2, May 2012.

Partila et al. "Jitter Buffer Loss Estimate for Effective Equipment Impairment Factor" International Journal of Mathematics and Computers in Simulation.

Yu et al. "Quality-based Jitter Buffer Algorithm Using Adaptive Variable-Size Window" 2nd International Conference on Computer Science and Network Technology, 2012.

Kim et al. "VoIP Receiver-Based Adaptive Playout Scheduling and Packet Loss Concealment Technique" IEEE Transactions on Consumer Electronics, vol. 59, No. 1, Feb. 2013.

Chen et al. "VoWLAN Simulations through Novel Playout Buffer Algorithm" Journal of Computers vol. 24, No. 1, Apr. 2013.

Carson et al. NIST Net: a Linux-based network emulation tool. SIGCOMM Comput. Commun. Rev.

Gong et al. "A New Optimum Jitter Protection for Conversational VoIP".

Kim et al. "A Novel Playout Algorithm for VoIP Mobile Phone".

McNeill et al. "An Adaptive Jitter Buffer Play-Out Scheme to Improve VoIP Quality in Wireless Networks".

Alwakeel et al. "An Adaptive Sender-Based VoIP Loss-Recovery Technique".

Bayley et al. "Call Quality Monitoring for VoIP".

Pang et al, "Complexity-Aware Adaptive Jitter Buffer With Time-Scaling".

Halas et al. "Computationally Efficient E-Model Improvement of MOS Estimate Including Jitter and Buffer Losses".

Syed et al. "Dynamic Adjustment of Weighting and Safety Factors in Playout Buffers for Enhancing VoIP Quality", Science and Information Conference 2013 Oct. 7-9, 2013 | London, UK.

Florencio et al. "Enhanced Adaptive Playout Scheduling and Loss Concealment Techniques for Voice over IP Networks".

Kim et al. "Enhancing VoIP Speech Quality Using Combined Playout Control and Signal Reconstruction", IEEE Transactions on Consumer Electronics, vol. 58, No. 2, May 2012.

Slavata et al. "Impact of Jitter and Jitter Buffer on the Final Quality of the Transferred Voice", The 1st IEEE International Symposium on Wireless Systems within the Conferences on Intelligent Data Acquisition and Advanced Computing Systems Sep. 20-21, 2012, Offenburg, Germany.

Oklander et al. "Jitter Buffer Analysis".

Mohsen et al. "Jitter-Buffer Management for VoIP over Wireless LAN in a Limited Resource Device", Fourth International Conference on Networking and Services.

Fu et al. "P2P-based VoIP QoS Management in Heterogeneous Networks".

Alwakeel et al. "Performance Study of a Random P-Persistence Sender-Based VoIP Loss-Recovery Technique".

Aamir et al. "QoS Analysis of VoIP Traffic for different Codecs and Frame Counts per Packet in Multimedia Environment using OPNET".

Kim et al. "VoIP QoS(Quality of Service) Design of Measurement Management Process Model".

Wu et al. "Perceptual optimization of playout buffer in voip applications" First International Conference on Communications and Networking in China, 2006. ChinaCom '06. Digital Object Identifier: 10.1109/CHINACOM.2006.344719.

* cited by examiner

MEDIA CONTROLLER

BACKGROUND OF THE INVENTION

This invention relates to a data processing device for playing out buffered media data packets to a media consumer.

Expectation of voice over internet protocol (VoIP) services is growing rapidly due to improvements in high-speed wireless internet technology and more powerful mobile devices. In packet-switched networks, the regularity of a VoIP stream is however naturally impaired by routing, queuing, scheduling and serialization effects, which result in loss and jitter (including delays) to data packets. The main factors affecting voice quality are in fact delay and loss which cannot generally be known in advance to the receiving device because they depend on the real-time behaviour of connections throughout the network.

Achieving high quality real-time voice transmission between VoIP devices requires mechanisms for smoothing out the jitter inherent in a received stream of network data packets. This is generally done by means of an Adaptive Jitter Buffer (AJB).

Most of the existing jitter buffer algorithms calculate play-out times of data packets to a media decoder using adaptive estimation of network jitter. The adaptive algorithm typically uses adaptive dual alpha or other relevant weighting factors, for example as is described in "Perceptual optimisation of playout buffer in voip applications", Chun-Feng Wu and Wen-Whei Chang, First International Conference on Communications and Networking in China, China-Com 2006. Network statistics and a history of measurements may also be used for controlling the adaptation, for example as described in "Jitter Buffer Loss Estimate for Effective Equipment Impairment Factor", Pavol Partila et al., International journal of mathematics and computers in simulation.

Such conventional algorithms can sometimes work under slightly impaired network conditions, but the behaviour of bursty traffic, self-similar traffic and long range dependent traffic often differs from the ideal stochastic models of absolutely independent packets which these techniques use when trying to assess or describe traffic inter-arrival times (e.g. using standard distributions such as Markov models, Poison distributions, exponential distributions, neural network modelling, etc.) These algorithms therefore suffer from suboptimal performance as these models can give wrong or inaccurate predictions on the inter-frame dependency between consecutive packets.

Recently EMOS (Equivalent Mean Opinion Score) based algorithms are becoming more popular due to better performance than the performance of adaptive estimation algorithms. EMOS algorithms for predicting the subjective quality of packetized voice have been standardised in ITU-T G.107. Examples of EMOS algorithms are described in "E-model MOS estimate precision improvement and modelling of jitter effects", Information and Communication Technologies and Services, Vol. 10, 2012. However, EMOS algorithms are sensitive to network delay and can often discard a significant number of packets even under slightly poor network conditions—for example, if a gateway or media server adds considerable fixed delay.

Both adaptive estimation and EMOS algorithms suffer severely when streams of network packets experience significant jitter and bunching effects.

BRIEF SUMMARY OF THE INVENTION

According to a first aspect there is provided a data processing device comprising:

a jitter buffer for receiving data packets;

a media decoder configured to decode the data packets so as to form a stream of media frames, each frame comprising a plurality of samples;

a media consumer having an input buffer for receiving the stream of media frames and being configured to play media frames from the input buffer according to a first frame rate;

a buffer interface configured to monitor the input buffer so as to detect when the number of samples at the input buffer of the media consumer falls below a predetermined level and, in response, generate a play-out request; and a media controller configured to, responsive to each of the generated play-out requests, play-out one or more data packets to the media decoder so as to cause media frames of the stream to be delivered into the input buffer at a rate commensurate with the first frame rate.

The buffer interface may be supported at the media consumer.

The buffer interface may be supported at the media controller.

The predetermined level may be at least the number of samples comprised in a media frame.

The buffer interface may be configured to periodically check the number of samples at the input buffer at a rate commensurate with the first frame rate.

The data processing device may further comprise a receive queue for receiving data packets from the data packets from a network, the media controller being configured to periodically store in the jitter buffer all of the data packets available at the receive queue whose timestamps are greater than the timestamp of the last data packet played out by the media controller.

The media controller may be configured to, on storing one or more data packets at the jitter buffer, increase the size of the jitter buffer by the size of those data packets.

The media controller may be configured to maintain a histogram representing a distribution of time periods between the timestamps of successive packets stored at the jitter buffer, the histogram indicating for each of a predetermined range of time periods a measure of the number of successive data packets separated by that time period.

The media controller may be arranged to update the histogram on storing each of the data packets.

The media controller may be configured to estimate a minimum size for the jitter buffer by identifying the lowest time period between the timestamps of successive packets for which the measure of the number of successive data packets separated by that time period is zero.

The media controller may be configured to cause the size of the jitter buffer to adapt so as to be at least the estimated minimum size.

The media controller may be configured to, responsive to each of the play-out requests, estimate the timestamp of the next packet to be played out from the jitter buffer based on the timestamp of the preceding data packet played out from the jitter buffer and the size of that preceding data packet.

The media controller may be further configured to estimate the timestamp of the next packet to be played out from the jitter buffer based on a measure of the number of media samples added or discarded in accordance with time scale modification algorithms operating at the data processing device.

The media controller may be configured to search the jitter buffer for a best match data packet having a timestamp equal to the estimated timestamp or within the size of one media frame of the estimated timestamp according to the codec in use at the decoder, and if such a best match data packet is identified, play out the best match data packet.

The media controller may be configured to decrease the size of the jitter buffer by the size of the best match data packet.

The media controller may be further configured to search the jitter buffer for the data packet having the lowest timestamp and, if that lowest timestamp is not equal to the timestamp of the best match data packet, discarding the data packet having that lowest timestamp.

The media controller may be configured to play out each best match data packet only if the last data packet played out by the jitter buffer was a SPEECH, DTX, or SID data packet.

The media controller may be configured to, if the size of the jitter buffer was zero on the preceding play-out request being received, play out a synthetic data packet selected in accordance with a time scale modification algorithm and irrespective of the presence or otherwise of a best match data packet.

The media controller may be configured to, if a best match data packet is not identified, play out:
  if the lowest timestamp is lower than the timestamp of the latest data packet played-out by the media controller, the data packet having the lowest timestamp provided that the latest data packet played out by the media controller was a DTX, LOST, EXP, or DTMF data packet, and otherwise discard the data packet having the lowest timestamp and play-out an EXP data packet;
  if the lowest timestamp is greater than the timestamp of the latest data packet played-out by the media controller then play-out a synthetic data packet selected in accordance with a time scale modification algorithm.

The media controller may be configured to, on each data packet being played out, iteratively search for each next best match data packet until an amount of data has been played-out to the decoder to satisfy a number of samples indicated in or represented by the play-out request.

The data processing device may further comprise a frame processor between the decoder and the input buffer, the frame processor configured to perform one or more of noise cancellation, automatic gain control, delay adjustment, sample rate conversion, and multiplexing of media streams.

The data processing device may further comprise packet concealment logic at the decoder or at a packet concealment module between the media controller and decoder, the packet concealment logic being configured to generate media samples in accordance with synthetic packets received from the jitter buffer.

The media controller may be configured to, on storing a data packet whose timestamp precedes the timestamp of the latest played-out data packet by less than the size of the data packet, store only that part of the data packet representing media samples subsequent to the timestamp of the latest played-out data packet, and discarding that part of the data packet representing media samples preceding the timestamp of the latest played out data packet.

Each of the said timestamps may be a send timestamp indicative of the time at which each respective data packet was sent over the network.

The data processing device may further comprise a first timer and the media controller being configured to, on receiving the play-out request, calculate an overflow size of the jitter buffer and to:

if the overflow size of the jitter buffer exceeds a first threshold, increment the first timer by a measure of the number of samples requested in the play-out request; and
  otherwise, reset the first timer to zero.

The media controller may be configured to, when the first timer exceeds a second threshold, generate one or more data packets so as to cause the decoder to perform compression by an amount selected in dependence on the overflow size.

The data processing device may further comprise a second timer and the media controller being configured to, when the first timer exceeds a third threshold:
  if the overflow size of the jitter buffer exceeds the first threshold, increment the second timer by a measure of the number of samples requested in the play-out request; and
  otherwise, not increment the second timer.

The media controller may be configured to, when the second timer exceeds a fourth threshold, generate one or more data packets so as to cause the decoder to perform compression by an amount selected in dependence on the overflow size.

The fourth threshold may be an adaptive threshold selected in dependence on the overflow size.

The media controller may be configured to reset the second timer to zero on generating the one or more data packets so as to cause the decoder to perform compression.

The overflow size may be the difference between a measure of the size of the jitter buffer on receiving the play-out request and the estimated minimum size of the jitter buffer.

The measure of the size of the jitter buffer may be an average size of the jitter buffer calculated in dependence on the size of the jitter buffer at one or more preceding play-out requests.

The media controller may be configured to select the amount of compression to be around 25% of the overflow size.

According to a second aspect there is provided a method for controlling a stream of data packets received over a network for a media consumer, the media consumer having an input buffer for receiving media frames decoded from the stream of data packets and being configured to play the media frames according to a first frame rate, the method comprising:
  receiving data packets into a jitter buffer;
  generating a play-out request when the number of samples comprised in media frames at the input buffer of the media consumer falls below a predetermined level;
  receiving the play-out request at the media controller; and
  responsive to that request, the media controller playing-out one or more data packets to a media decoder so as to cause media frames decoded from the stream of data packets to be delivered into the input buffer at a rate commensurate with the first frame rate.

Receiving data packets into the jitter buffer may comprise periodically storing in the jitter buffer all of the data packets available at a network receive queue whose timestamps are greater than the timestamp of the last data packet played out by the media controller.

The method may further comprise:
  estimating the timestamp of the next packet to be played out from the jitter buffer based on the timestamp of the preceding data packet played out from the jitter buffer and the size of that preceding data packet;
  searching the jitter buffer for a best match data packet having a timestamp equal to the estimated timestamp or within the size of one media frame of the estimated timestamp according to the codec in use at the decoder; and if such a best match data packet is identified, the media controller playing-out the best match data packet.

The method may further comprise iteratively searching for each next best match data packet and playing-out each such best match data packet until an amount of data has been played-out to the decoder to satisfy a number of samples indicated in or represented by the play-out request.

There is provided a non-transitory machine readable storage medium having stored thereon processor executable instructions for generating the data processing device or media controller.

There is provided a non-transitory machine readable storage medium having stored thereon processor executable instructions for implementing the method of controlling a stream of data packets.

BRIEF DESCRIPTION OF THE DRAWINGS

The present invention will now be described by way of example with reference to the accompanying drawings. In the drawings.

DETAILED DESCRIPTION

The following description is presented by way of example to enable any person skilled in the art to make and use the invention. The present invention is not limited to the embodiments described herein and various modifications to the disclosed embodiments will be readily apparent to those skilled in the art.

There is a need for a jitter control mechanism which provides improved performance over conventional techniques when a received network data stream experiences significant jitter, including in the face of high packet delays.

A data processing device is provided that includes a media controller and jitter buffer configured to play out data packets in response to play-out requests from a buffer interface. A data processing device configured as described herein could consume any kind of media, including audio and video, and the media frames generated by a decoder of the data processing device can be any grouping of samples or media data appropriate to the particular implementation (e.g. for an audio consumer, each media frame can be an audio frame comprising a fixed or variable number of media samples). The data processing device can receive data packets according to any suitable network protocol. Since the play-out of data packets from the buffer is not performed according to a timer of the media controller but in response to play-out requests generated according to frame consumption by the media consumer, the device does not suffer from the problems associated with clock skew between a clock supporting a timer-controlled adaptive jitter buffer and a clock at the media consumer controlling the play rate of media frames.

Figure 1:
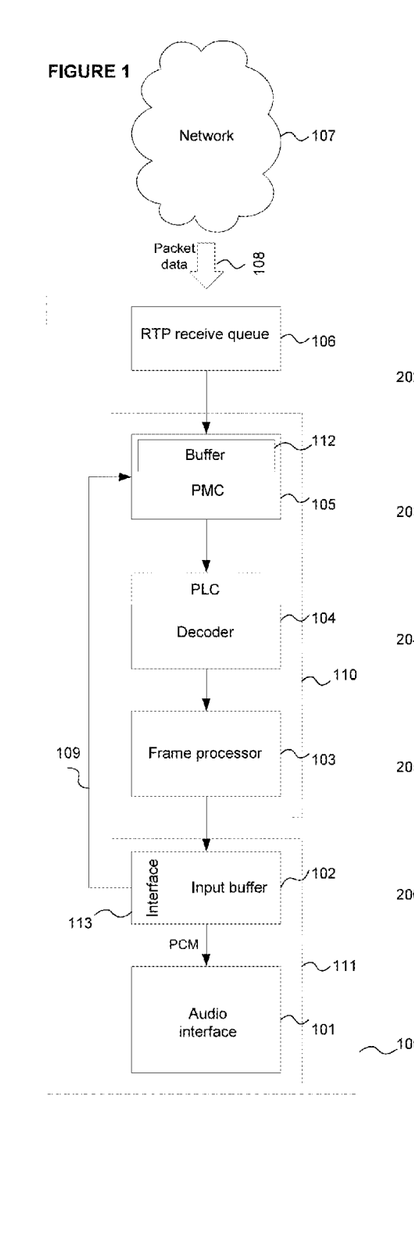
FIG. 1 shows a schematic diagram of a data processing device according to an example of the present invention.

FIG. 1 shows a receive path of a data processing device 100 comprising a media consumer 111, media processor 110 and a receive queue 106 for receiving packet data 108 from a network 107. The media processor 110 includes a decoder 104 for decoding data packets received from the network at the receive queue and forming a stream of media frames. The media consumer receives the decoded media stream into an input buffer 102 from which a media interface 101 reads media frames for playing by the media consumer. In the example shown in FIG. 1, the media consumer is an audio device comprising an audio interface 101, the data packets 108 carrying media data are RTP (Realtime Transport Protocol) data packets, and the media stream is a PCM (Pulse Code Modulation) audio stream. The receive queue 106 would in this example typically be a receive queue of an RTP socket. Decoder 104 decodes data packets according to the appropriate codec for the received media streams. Audio codecs typically used for speech compression and decompression include ITU-T G.711, ITU-T G.729AB, ITU-T G.723 and ITU-T G.722.

The media processor 110 includes a play-out media controller (PMC) 105 configured in accordance with the teaching herein and can optionally include a frame processor 103 for processing media data decoded by the decoder 104. The PMC 105 comprises a jitter buffer 112 and logic for controlling the buffer in accordance with the principles described herein. The PMC, decoder and frame processor need not be provided at a common processing entity and are shown grouped together in FIG. 1 at a media processor 110 for illustrative purposes only. Generally, the PMC, decoder and frame processor can be provided by any suitable combination of hardware and/or software functions. Only one media stream is shown in FIG. 1 but in practice there could be multiple media streams on the receive path stemming from one or more receive queues, each stream terminating at the media interface 101.

Only the receive path of the data processing device is shown in FIG. 1. The data processing device could further provide a transmit path for processing a media stream and generating media data packets for transmission over the network. For example, if the data processing device is capable of VoIP (Voice-over-Internet Protocol) communication, the device could comprise a speaker coupled to the media consumer for playing decoded PCM data received over the network and a microphone arranged to generate PCM data from a media source (such as, for example, a user's voice) for encoding into data packets that are transmitted over the network. In this manner the data processing device could provide an endpoint for a two-way VoIP conversation.

Conventionally, the receive path of a data processing device for consuming media data received over a network would be arranged to (a) periodically read data packets from the receive queue into an adaptive jitter buffer, and to (b) periodically play-out packets from the adaptive jitter buffer for decoding according to a timer of the jitter buffer. Both (a) and (b) would be performed according to algorithms for jitter control (e.g. that estimate network jitter or use an EMOS measure of network conditions) which operate with reference to a timer available to the jitter buffer. This approach often leads to accumulation or depletion of packets at the jitter buffer due to one or more of the following reasons.

a. A media consumer typically plays media data at a rate controlled by a hardware timer of the media consumer. Since the adaptive jitter buffer will generally be supported by a different clock, clock skew can become a significant problem over time as a media stream is played-out. This is due to drift between the clock of the media consumer and the clock accessible to the adaptive jitter buffer (often a low accuracy system timer).

b. Where a media consumer further receives media data from a jitter buffer by means of one or more intermediate application layers, those layers can introduce further sources of skew due to clock drift between the timers on which the application layers are based and the hardware timer of the media consumer.

c. In certain instances a media consumer can require multiple media frames in quick succession (e.g. when playing media at an accelerated rate); such instances cannot be efficiently serviced by an architecture in which the jitter buffer is arranged to continuously push out data packets at a given rate.

The data processing device shown in FIG. 1 overcomes these problems by arranging that play-out requests are sent to the PMC 105 at a rate commensurate with the frame rate at which decoded frames are being consumed by the media consumer 111. This is achieved by arranging that a buffer interface 113 signals play-out requests to the PMC. The PMC does not therefore play-out data packets at a rate determined by its timer based on estimates of jitter or EMOS measures of network conditions. In this manner, the play-out of data packets from the PMC is independent of the time at which the data packets are received at the data processing device; rather the play-out of data packets depends on their send timestamps. The buffer interface could be configured to generate play-out requests at a rate proportional to the frame rate at which the media consumer plays frames from its input buffer such that new frames are delivered into the input buffer at the appropriate rate. For example, the buffer interface can be configured to ensure that new samples/frames are delivered into the input buffer at the appropriate rate by detecting when the number of samples (or frames) at its buffer interface drops below a predetermined level—e.g. for a VoIP implementation, fewer than 20 ms of samples has been found to offer good performance.

In FIG. 1, the buffer interface 113 is shown as being part of the media consumer, but more generally it could be supported at any suitable aspect of the data processing device. For example, the buffer interface could form part of the PMC itself, with the interface being arranged to monitor the input buffer 102 of the media consumer in order to detect when the number of samples (or frames) at the buffer interface drops below a predetermined level. The buffer interface could be a software thread tasked with polling the input buffer in order to identify when the number of samples (or frames) drops below a predetermined level. The buffer interface could be one and the same as the media consumer, with the buffer interface being that aspect of the media consumer configured to detect whether the number of samples at the input buffer has dropped below the predetermined level—this could be done when the media consumer accesses the input buffer to play out samples.

Allowing the consumption of media samples by the media consumer to control the play-out of data packets from the PMC avoids the complexity associated with jitter buffers of having to estimate the level of jitter in the network 107, and, in the case of EMOS mechanisms, avoids the poor performance encountered during periods of network delay.

The data processing device of FIG. 1 is configured as follows. The buffer interface 113 is configured to signal play-out media controller (PMC) 105 by means of a play-out request 109 so as to cause the PMC to play-out data packets from its jitter buffer 112 to the decoder 104. For example, each play-out request could cause the PMC to play-out one or more data packets, a sufficient number of data packets to correspond to a given number of samples, or data packets corresponding to a given set of samples (this could be specified by the sequence numbers of those samples). The data for each media frame (such as an audio or video frame) would typically be carried in multiple data packets. The buffer interface can be arranged to signal multiple play-out requests in order to cause the PMC to play-out sufficient data packets to form each media frame for delivery into input buffer 102, or to service a play event performed by the media consumer which comprises a given number of samples/frames.

Each play-out request could indicate to the PMC to play-out a predetermined number of one or more data packets from jitter buffer 112, or to play-out data packets carrying data in respect of an indicated number of samples/period of time (e.g. a range of one or more media frame sequence numbers). For instance, each play-out request could include an indication of the number of samples required to satisfy a play event to be performed by the media consumer, or each play-out request could itself represent to the media controller that some predefined number of samples are to be played-out.

By arranging that play-out requests are generated until there is sufficient data in the input buffer 102 to service a play event, the PMC is not required to estimate the rate at which it must pass data packets onto the decoder. Such estimates are not straightforward because, as well as the fact that with many media codecs there can be a complex relationship between the size of data packet payload and the play length that payload represents, typically there will be gaps in a data packet stream due to late or missing packets. These gaps can be filled by expansion techniques provided by time scale modification algorithms (e.g. playing synthetic data in place of the missing packet), but these techniques further complicate the estimation of the rate at which data packets might be required at the media consumer.

By arranging that play-out requests are sent to the PMC when the media consumer requires data, any skew between the clock of the media consumer and the clock available to the PMC becomes irrelevant in terms of controlling the play-out rate of the data packets. Furthermore, the rate at which media frames are provided to the input buffer of the media consumer can be maintained commensurate with the rate at which the media consumer consumes those frames. This is true irrespective of the processing performed between the PMC and the input buffer 102, such as processing to compensate for delays and gaps between frames, as well as decoder processing according to a given codec. Thus, the media consumer receives data at the correct rate in a manner that is platform-independent and insensitive to the implementation-specific packet and frame processing performed at a given data processing device.

Figure 2:
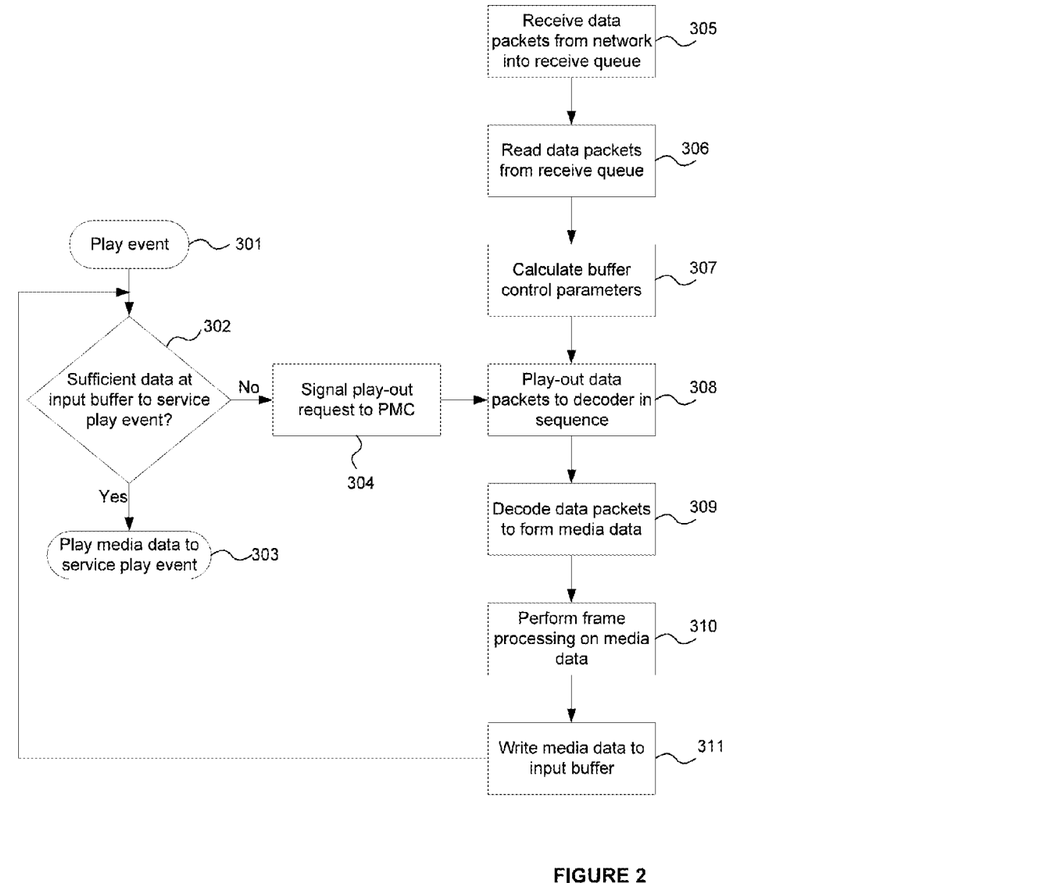
FIG. 2 is a flowchart illustrating a method performed by the data processing device.

FIG. 2 illustrates an exemplary method performed by the receive path of the data processing device of FIG. 1 in order to play a media stream received over network 107 in a series of data packets. On a play event 301 being scheduled at the media consumer 111, the buffer interface 113 of the media consumer checks at 302 whether sufficient media data is present at its input buffer 102 to service that play event. If there is, that media data is read from the input buffer 102 and played by the media consumer at 303 at the appropriate time in accordance with the scheduled play event. If there is not sufficient media data at its input buffer to service the play event, the buffer interface generates a play-out request 304 and signals the PMC 105 so as to cause the PMC to play-out the appropriate data packets for decoding. Independently of the operation of the media consumer, at 305 the receive queue 106 accepts data packets carrying media data from the network.

On receiving packets from the network, the PMC reads data packets from the receive queue 306 into its jitter buffer 112 and calculates one or more buffer control parameters 307, as appropriate to the particular implementation and as described in more detail below. This step can be termed the storing process and is performed independently of the play-out of data packets from the jitter buffer. The PMC could read all of the data packets in the receive queue, a predetermined number of data packets, or a number of data packets determined in dependence on one or more parameters of the system (such as a measure of available space in a data store at which the jitter buffer is supported).

In response to each play-out request, the PMC plays out 308 one or more data packets from its buffer 112 in sequence to decoder 104 for decoding 309. The number of data packets played out can depend on an amount of data indicated in each play-out request, e.g. a number of samples, or length of samples in milliseconds required to service a play event. Step 308 can be termed the packet pick-up process. Typically, various processing steps 310 will be performed on the frame data generated by the decoder at the frame processor 103. These are described in more detail with reference to FIG. 3. Finally, at 311 the processed frame data is written to the input buffer 102. According to its schedule, the buffer interface again checks whether there is sufficient data at the input buffer to service the play event. If there is now sufficient data, the play event is performed 303; if not, a further play-out request is sent to the PMC.

It should be appreciated that FIG. 2 does not suggest that the buffer interface 113 must wait for the PMC to cause frame data to actually be posted into the input buffer 102 before it checks again whether there is sufficient data in the input buffer to service the play event. In fact, the buffer interface would preferably periodically check the input buffer for data independently of the progress of the PMC, decoder and frame processor. This avoids the media consumer becoming stalled and ensures that the buffer interface checks for data at a rate appropriate to its play rate of the media stream. For example, if the media consumer requires media frames at a certain rate, the buffer interface 113 can be configured to check its input buffer 102 at a frequency such that, through the signalling of play-out requests, the PMC is caused to deliver data packets into the receive chain at a rate appropriate to meet the demand for data from the media consumer. The media consumer would typically check its input buffer for data at a frequency commensurate with the rate at which the media consumer requires new frames for playing.

It is advantageous if the buffer interface is configured to poll the input buffer at a rate which is greater than the rate at which samples are being consumed by the media consumer from the input buffer 102. For example, if each frame is 20 ms in length then the buffer interface is preferably configured to poll the input buffer at least as frequently as every 10 ms. This helps to ensure that play-out requests are generated at an early opportunity when the number of samples at the input buffer drops below a predetermined level.

Figure 3:
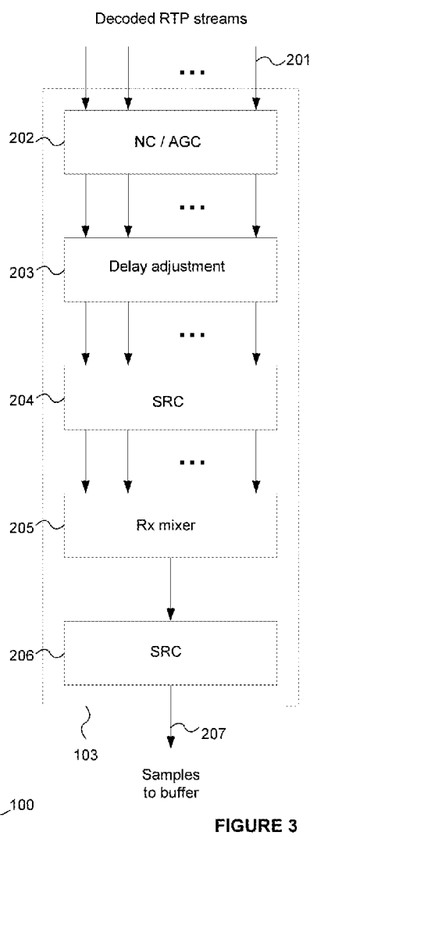
FIG. 3 is a schematic diagram of a frame processor of the media controller.

Decoded frame data provided by decoder 104 could optionally be subject to various types of processing, as appropriate to the codecs used and the particular implementation. An example of a frame processor 103 adapted for performing such processing is illustrated in FIG. 3 for concurrently handling a plurality of decoded RTP media streams 201 of the type decoded at decoder 104. The frame processor could perform any suitable processing of media frames as is known in the art, including noise cancellation (NC) and/or automatic gain control (AGC) 202, delay adjustment 203, sample rate conversion 204/206 for converting multiple media streams into a common sample rate (e.g. ITU-T G.711 uses an 8 kHz sample rate, G.722 a 16 kHz sample rate, etc), and a mixer for multiplexing of a plurality of media streams 205 into a single stream of media frames 207 for provision to the input buffer 102.

Lost packets, packets discarded by the PMC due to high jitter variation, or problems with higher order out of sequence packets can be concealed through the use of Packet Loss Concealment (PLC) algorithms. This improves voice quality. In the event that the codec being used supports PLC, the decoder supports the Packet Loss Concealment algorithms. In the event that the codec that does not support PLC, the Packet Loss Concealment algorithms can be supported at a Packet Loss Concealment module as shown in FIG. 1. The Packet Loss Concealment algorithms defined in the ITU-T G.711 Appendix I provide good quality with very low complexity. It is the Packet Loss Concealment algorithms that support the synthesis of media samples in response to LOST data packets generated by the PMC as will be explained below. For example, in response to a LOST data packet generated by the PMC, the PLC algorithms can be configured to repeat the preceding data packet.

A data processing device as described herein could be implemented according to any suitable combination of hardware and software functionalities. For example, the receive path of the data processing device shown in FIG. 1 could be implemented entirely in hardware, entirely in software, or as a combination of both hardware and software. In one example, audio interface 101 is a kernel driver of an operating system supported at the data processing device, and frame processor 103, decoder 104, PMC 105 and buffer interface 113 are implemented in software at application-level. Kernel driver 101 would in this case provide a software interface to audio hardware configured to effect the playing of media frames received into input buffer 102. For instance, the audio hardware could include a DAC (digital to analogue converter) to which the PCM frames are directed by the interface for conversion into analogue signals for driving a speaker. In a software implementation of the PMC, the play-out request could be a call to an API provided by the PMC.

As well as playing out packets at the request of the buffer interface, the PMC 105 performs ordering of data packets received at the receive queue 106 into their proper play sequence. This can be performed on play-out of the packets from the PMC according to a packet pick-up process.

On packet data being received into the receive queue 106, the PMC stores at the jitter buffer all the packets which have been received into receive queue 106. The packet storing process involves unpacking the data packets (e.g. their RTP headers) into the receive queue. Packet ordering need not be performed at this stage. It is further advantageous to form one or more buffer control parameters to aid in the proper ordering of data packets and to permit packet validation, overlap time stamp correction and the formation of out-of-order distributions in dependence on which the size of buffer 112 can be adapted.

On receiving each play-out request, the PMC invokes a packet pick-up process in order to play-out packets held at buffer 112 to the decoder. The packet pick-up process is preferably independent of the packet storing process. The packet pick-up process searches jitter buffer 112 of the PMC for the next packet to provide to the decoder given, at each instance, the last packet provided to the decoder. The searching can be facilitated by the buffer control parameters generated by the storing process.

If on receiving a play-out request the jitter buffer 112 is empty, synthetic packets can be generated in the manner described below so as to trigger packet concealment mechanisms in the receive chain.

Examples of the storing and packet pick-up processes will now be described in more detail.

Storing Process and Buffer Control Parameters

In the present example, the storing process involves unpacking the media payload of received data packets from their RTP headers and storing the data packets in buffer 112. The PMC does not however store packets having timestamps earlier than those data packets it has already played out—such packets are discarded since they represent missing late packets from an earlier media frame. A late gap parameter can be formed to indicate which data packets are to be discarded, as follows.

Late Gap Parameter

For each packet read from the receive queue, a time stamp gap $ts_l(k)$ between last played packet and current received packet is estimated by subtracting their send time stamps representing the time those packets were sent:

$ts_l(k)=ts_p(k)-ts(k)$ where $ts_p(k)$ corresponds to the timestamp of the latest played packet and $ts(k)$ corresponds to the timestamp of the received packet.

A negative value of time stamp gap $ts_l(k)$ indicates that the packet received is a late arrival and should be discarded. The late gap parameter in millisecond is estimated from the time stamp gap $ts_l(k)$ as:

$$late\_gap = 2^{-ms\_convf(k)} ts_l(k)$$

Where $ms\_convf(k)$ is a millisecond conversion factor for the codec used. Suitable values for the conversion factor are 3 for narrowband or 8 kHz sampling rate codecs, 4 for wideband or 16 kHz sampling rate codecs, and 5 for super wideband or 32 kHz sampling rate codecs (and so on). Thus, received packets with a corresponding negative late gap are discarded.

Histogram Parameters

Further buffer control parameters can be formed during the storing process, including one or more histograms which can be used to adapt the size of buffer 112. The first histogram is a short term out of order distribution which can be updated as packets are read from the receive queue as follows. Firstly the time stamp gap $ts_d(k)$ between successive packets received can be estimated by subtracting the previous packet's time stamp, $ts(k-1)$, from the time stamp of the current packet received, $ts(k)$:

$$ts_d(k)=ts(k)-ts(k-1)$$

A negative value of time stamp gap $ts_d(k)$ indicates that the packet received is out of order. The out of order gap $o_d(k)$ is estimated by imposing a ceiling on the time stamp gap $ts_d(k)$ of 0 as given below:

$$o_d(k) = \begin{cases} 0 & \text{if}(ts_d(k) > 0) \\ -ts_d(k) \end{cases}$$

otherwise

The out of order gap $o_d(k)$ is converted into milliseconds and quantized into 10 ms segments to give a quantized gap $o_q(k)$, by:

$$o_q(k)=(2^{-ms\_convf(k)}o_d(k)+9)/10$$

where again $ms\_convf(k)$ is the millisecond conversion factor of the codec.

The PMC is configured to maintain an array representing a histogram of the quantized out of order gaps. A packet segment number $sg\_no$ indicated by a counter $vt\_ofo$ that is supported at the PMC and incremented every time the PMC plays out a packet can be used as an index for the array as follows, with each quantized out of order value of the $k^{th}$ packet being stored against its corresponding packet segment number:

$$ofo_{hist}(sg\_no,o_q(k))=ofo_{hist}(sg\_no,o_q(k))+1$$

The short term histogram of $o_{hist}$ can be configured to store quantized out of order values for a predetermined length of time, e.g. 15 seconds is typically appropriate in data processing devices for VoIP implementations. In the present example, the duration of each segment is 100 ms and hence the histogram contains 150 segments, each segment containing 20 locations to store quantized out of order information of late received packets (typically up to some maximum delay, such as 200 ms).

A long term histogram of the out of order distribution can also be updated as packets are read from the receive queue during the storing process. The long term histogram represents the distribution of quantized out of order gaps for a predetermined number of packet segments (e.g. a sum of the quantized out of order gaps for the last 120 packet segments). For example, let M be the number of segments and N be the maximum quantized out of order gap considered, then the long term out of order distribution, of $o_{lt}(k)$, can be estimated as:

$$ofo_{lt}(k) = \sum_{j=1}^{j \leq M} ofo_{hist}(j,k) \; k = 1, 2, \ldots, N$$

Limiting this calculation to a maximum number of segments N can help to avoid high memory usage and delay. Typically only a small number of packets will have a delay which exceeds N.

In other examples, the time stamp gap can be used in place of the out of order gap to calculate the short and long term histograms.

Minimum Size of Jitter Buffer

The long term histogram can be used to estimate a minimum size for buffer 112. The long term histogram $ofo_{lt}$ is 2D filtered using a window $B_1=[111111]$. The index corresponding to the $1^{st}$ zero ($Z_{indx}$) in the filtered output is used as an estimate of the minimum jitter buffer size. Let y be the filtered output and $y_{zindx}$ be the first index of the filtered output that has zero output, then the minimum jitter buffer size, $jb^e_{ms}(k)$, is:

$$jb^e_{ms}(k)=(y_{zindx}-1)*10$$

The size of the buffer can then be adapted so as to be at least the minimum buffer size.

Once the buffer control parameters have been updated, the respective data packet is stored in the buffer. The buffer therefore includes all valid data packets whose timestamps are later than the timestamp of the last data packet played out by the PMC. For each data packet stored in the buffer, the size of the buffer is incremented by the size of that data packet.

Loss Impact on Jitter Buffer Size

When there is no loss in the network, the size of the jitter buffer maintained according to the mechanisms described above represents the correct value. However, when packet loss occurs, the size of the jitter buffer will not be correct. Whenever there is significant loss in the network, the jitter buffer size $jb_{size}(k)$ is lower than the true value. Hence, it is possible that $jb_{size}(k)$ is greater than the minimum jitter buffer size $jb_{ms}^e(k)$ and yet compression will not be invoked where in fact compression should be performed in order to control the buffer size. It is therefore important to account for the impact of packet loss on $jb_{size}(k)$ for proper delay control.

The impact of packet loss on jitter buffer size can be accounted for as follows. One or more counters are established to keep track of the number/duration of samples lost as a result of partial or complete packet loss. For example, each time the number of samples lost exceeds a defined segment of time, a value representing that segment can be stored in a corresponding buffer. The corrected size of the jitter buffer, $jb_{corr}$, can then be given by:

$$jb_{corr} = \left(1 + \frac{\text{total length of segments lost}}{\text{length of a segment}}\right) jb_{ms}^e$$

In other words, the minimum jitter buffer size can be scaled by the number of segments of time lost.

Packet Pick-Up Process

If the buffer 112 is not of zero size (i.e. contains at least one data packet) and the late gap of the last played-out packet is zero, the PMC performs the packet pick-up process which plays out data packets from the jitter buffer in sequence to the decoder. Preferably the packet pick-up process is performed independently to the storing process because this means the next packet for play-out is more likely to be found when the buffer is searched (due to network jitter packets may be received out of order into the receive queue). The packet pick-up process could be performed concurrently such that the pick-up process overlaps the storing process. If the buffer is of zero size (i.e. is empty) and the late gap of the last played-out packet is greater than zero (it cannot be less than zero since those packets are discarded), then the buffer can generate one or more EXP (expansion) packets to cause subsequent entities in the receive chain to generate synthetic samples to fill the missing period in the stream of media data. EXP packets can cause the decoder to generate synthetic samples to fill a timegap of the length indicated by the EXP packet. This is performed in accordance with a time scale modification (TSM) scheme in place at the decoder.

The packet pick-up process then estimates the expected timestamp and sequence number of the next packet which is expected to be played. In the present example, the expected timestamp, $ts^e(k)$, and sequence number, $sqn^e(k)$, of the $k^{th}$ packet can be calculated as:

$$ts^e(k) = ts(k-1) + 2^{ms\_convf(k-1)} \text{pkt\_sz}(k-1)$$

$$ts^e(k) = \begin{pmatrix} ts(k-1) + 2^{ms\_convf(k-1)} \text{pkt\_sz}(k-1) + \\ dtx(k-1) + phcd(k-1) \end{pmatrix}$$

$$sqn^e(k) = sqn(k) + 1 + phcd\_pkt(k-1)$$

where, $ts(k-1)$ is the timestamp of the previous $(k-1)^{th}$ packet, $pkt\_sz(k-1)$ is the size of that previous packet, and $dtx(k-1)$ and $phcd(k-1)$ represent corrections in the event that the data processing device supports the use of discontinuous transmission (DTX) frames and phase synchronization. $dtx(k-1)$ is a measure of the number of samples comprised in DTX frames played following the previous packet played out by the PMC, and $phcd(k-1)$ represents the number of samples discarded for phase synchronization following the previous packet. $sqn(k)$ is the next sequence number after the sequence number of the previous packet played out by the PMC. $phcd\_pkt(k-1)$ represents the number of best match packets discarded for phase synchronization following the previous packet played out by the PMC.

The PMC then searches in its buffer for a packet having the expected timestamp $ts^e(k)$ or sequence number $sqn^e(k)$ using an appropriate search algorithm. A linear search algorithm has been found to offer good performance. This packet is referred to as the best match packet (BMP). The PMC also searches for the minimum timestamp packet (MTP) or minimum sequence number packet (MSP) (i.e. those packets having the minimum timestamp or sequence number) in its buffer.

If a valid best match packet having the expected timestamp or sequence number is found, it is played out unless at the last attempt to play out a packet the jitter buffer was empty. It can be useful to check whether the best match packet is valid according to the mechanism described below. If at the last attempt to play out a packet the buffer was empty, the PMC is configured to play out a synthetic packet such as a DTX, DTMF (Dual-tone multi-frequency) or expansion packet that will cause the decoder and/or frame processor to generate synthetic samples. The selection of a DTX, DTMF, or EXP packet would be made according to the communication protocols in operation at the data processing device; generally the selection will be dependent on the type of one or more preceding data packets played out by the PMC. Furthermore, if at the last attempt to play out a packet the buffer was empty, it can be advantageous to increase the size of the buffer, for example by playing an expansion frame. This is because an empty buffer is a sign of a high level of network jitter for which a larger buffer would be appropriate.

On playing out the best match packet, the size of the buffer 112 is correspondingly decreased:

$$pkt\_sz(k) = bm\_sz(k)$$

$$jb_{size}(k) = jb_{size}(k-1) - pkt\_sz(k)$$

where $pkt\_sz(k)$ is a working packet size parameter, $bm\_sz(k)$ is the size of the best match packet and $jb_{size}(k)$ is the size of the buffer, and k is the packet index.

Minimum Timestamp Packet Validation

The PMC searches for both the best match packet (BMP) and the packet having the minimum timestamp (MTP) or, equivalently, the minimum segment number (MSP). When a best match packet is found, both the MTP/MSP and BMP should be same. Otherwise the MTP/MSP packet is an invalid or old packet and is discarded from the buffer. The size of the buffer is then also updated:

$$jb_{size}(k) = jb_{size}(k) - mtp\_sz(k)$$

where $mtp\_sz(k)$ is the size of the MTP/MSP packet.

Best Match Packet Validation

If the last played packet is a packet of type SPEECH (i.e. a regular packet carrying media samples for a frame), DTX or SID (Silence Insertion Description) packet, then the best match packet is considered as valid packet and played-out.

If the last packet played is a SYNTHETIC packet of type EXP or LOST but the packet before that was a SPEECH packet, then an estimate of the expected timestamp for the best match packet is formed. LOST packets can be generated by the PMC so as to trigger the operation of packet loss concealment algorithms in the receive chain. The number of samples concealed by a sequence of one or more LOST frames can be determined through the use of a counter lost(k_1) which is incremented by the appropriate number of samples when a LOST packet is played-out and reset to 0 when another packet type is played-out. With lost(k_1) being number of samples concealed from the LOST frames after $(k-1)^{th}$ packet played, and lost_pks(k-1) be number of lost packets played after the $(k-1)^{th}$ GOOD packet played. Then the expected timestamp of the BMP is:

$$ts_{bm}^{e}(k) = ts(k-1) + lost(k-1) + pkt\_sz(k-1)$$

Then the timestamp gap $ts_d^{bm}(k)$ between time stamp of the BMP $ts_{bm}(k)$ and expected timestamp of BMP $ts_{bm}^{e}(k)$ is calculated. If the time stamp gap $ts_d^{bm}(k)$ is zero or lower than codec frame size, the BMP is considered valid and played out. Similarly, if the timestamp gap $ts_d^{bm}(k)$ is greater than 10 times the codec frame size, or the packet type of the BMP is either SID or DTX, the BMP is considered valid and played out.

Otherwise the BMP is treated as invalid and discarded.

Validation of Buffer Size

If the timestamp gap $ts_d^{bm}(k)$ is smaller than the size of the BMP, the size of the buffer is considered optimal. When the timestamp gap $ts_d^{bm}(k)$ is greater than size of BMP, the size of the buffer is checked using the following condition:

$$jb_{size}(k) \geq jb_{ms}^{e}(k) + codec\_frsz + 10$$

$$jb_{ms}^{e}(k) \leq 2pkt\_sz(k)$$

where codec_frsz is the frame size of the codec according to which the packet is formed. It depends on the codec used. Its value for general codecs like G711 or G722 codec is 10 ms and for the AMR codec is 20 ms.

If both of the above conditions are satisfied, the jitter buffer size is not optimal and the best match packet is discarded. The next best match packet is then searched for in the jitter buffer. Otherwise the buffer size is optimal and the best match packet is played-out.

Frame Prediction

In the case that the best match packet is not found in the jitter buffer, a frame prediction algorithm is invoked by the PMC. The algorithm provides two prediction methods which are selected using a lag parameter. lag is formed from the timestamp gap $ts_d^{lag}(k)$, which is the timestamp gap between the minimum timestamp packet (MTP) and the timestamp of the last played packet:

$$lag(k) = \begin{cases} 1 & if(ts_d^{lag}(k) > 0) \\ 2 & otherwise \end{cases}$$

When lag(k)=2 the timestamp of the MTP is lower than the timestamp of the last played packet, which indicates that the MTP is a late packet. If the last packet played out was an EXP, DTMF, DTX or LOST packet, the minimum timestamp packet is played out in the place of the best match packet. Otherwise, the MTP is discarded and an EXP packet is played out.

The value of lag(k)=1 indicates that the expected packet is not available but one or more future packets are available—i.e. the expected packet might be lost in the network or is going to arrive late. The selection of the frame type during this case can be controlled in accordance with any suitable algorithm for coping with missing packets or gaps between packets. These can include the use of EXP packets to cause the decoder to replace the missing packet with synthetic samples, a DTMF packet to cause the decoder to replace the missing packet with one or more tones, an SID or DTX packet to cause the decoder to insert silence, or a LOST packet to cause a subsequent entity of the receive chain (such as at a packet concealment module or PCM as described above) to replace the missing packet in accordance with a concealment algorithm at that entity. The choice of synthetic packet can depend on many factors, such as the past frame played, buffer size, and the timestamp gap between the last played out packet and the next immediate available packet's timestamp.

By performing the packet pick-up process for each packet held at its jitter buffer, the PMC 105 achieves the play-out of data packets in sequence and allows synthetic packets generated according to algorithms running at the PMC to be generated. This ensures that the decoder 104 is provided with a continuous stream of data packets from which it can generate a continuous stream of samples for media frames, without gaps between frames or missing data. The decoder can therefore be optimised purely for decoding and is not required to perform packet concealment on the fly.

Overlap Timestamp Correction

One of the most commonly used methods to sustain voice quality during bad network conditions is to resend missing payloads by piggybacking the missing payloads at the transmitter with subsequent payloads. RFC 2198 provides the interoperability requirements for such schemes. However, interleaving payloads is not possible in the data processing device described herein since each payload should represent a continuous segment of data. In order to address this, the PMC is configured to detect timestamp overlaps between the media data carried in data packet payloads and discard those parts of payloads that have already been received in preceding data packets.

Correction of overlapping timestamps can be achieved by configuring the packet storing process of the PMC to discard in their entirety those packets whose timestamp precedes the timestamp of the last played-out data packet by at least the size of a data packet (see the late gap parameter above). If during the storing process the timestamp of a data packet read from the receive queue precedes the timestamp of the last played-out data packet by less than the size of a data packet, then that part of the payload of the received data packet which falls subsequent to the timestamp of the last played-out data packet is stored in the buffer and the earlier portion is discarded. A data packet payload can be divided into segments each representing a certain the length of a sample according to the codec used (e.g. 10 ms for many audio codecs). This ensures that a data packet payload is not split at an inappropriate point and maintains the integrity of the payload media data.

Buffer Compression Management

In order to cope with overflow conditions at the jitter buffer (e.g. a larger than expected buffer size due to network jitter), buffer compression algorithms can be used to maintain a smooth flow of data packets to the decoder whilst reducing the size of the buffer back to its desired level. A buffer compression algorithm suitable for use at the PMC will now be described.

The overflow size of the jitter buffer can be given by the difference in size between the current (potentially average) size of the buffer (i.e. for the current data packet k required for play-out) and the calculated minimum size of the buffer $jb_{ms}^e(k)$ described above, as potentially modified by any loss impact mechanisms in operation at the media processor 110. Thus, the average overflow size can be defined as:

$$jb_{avg} = jb_{size}(k) - jb_{ms}^e(k)$$

where $jb_{size}(k)$ is the current size of the jitter buffer.
the average overflow size is defined as:

$$of_{ms}(k) = jb_{avg}(k) - jb_{ms}^e(k)$$

where $jb_{avg}(k)$ is the average size of the jitter buffer. In order to avoid sharp changes in overflow size, it is advantageous if $jb_{avg}(k)$ is an average value calculated from the current and previous $k-1^{th}$ data packet. In one example, the average size of the buffer can be calculated from:

$$d_3(k) = \begin{cases} 0 \text{ if } jb_{size}(k) \geq jb_{ms}^e(k) \\ 0 \text{ elseif } lag(k) = 1 \\ 0 \text{ elseif the last packet was a } DTX \text{ or } SID \text{ packet} \\ jb_{size}(k) - jb_{avg}(k-1) \text{ otherwise} \end{cases}$$

$$jb_{avg}(k) = jb_{avg}(k-1) + \alpha(k) d_3(k)$$

where $jb_{size}(k)$ is the current size of the jitter buffer for data packet k, and $$\alpha(k) = 2^{-\left(1 + \frac{pkt\_sz(k)}{10}\right)}$$

is an averaging factor with pkt_sz(k) the size in milliseconds of data packet k.

A two-stage timer mechanism can be used with the PMC in order to control fluctuations in the size of the jitter buffer. An overflow detection timer can provide the first stage of control. The overflow detection timer is configured to, when the average overflow size is greater than zero, increment from a starting point of zero on each play request being received at the PMC. The timer is incremented by the size of the play request received. For example, if a play request is received for 10 ms of packet data, the overflow detection timer will increase by 10 ms. It will be appreciated that metrics other than the time represented by data packets could be used by the overflow detection timer, such as a number of samples or an amount of data. The overflow detection timer is reset to zero whenever the size of the jitter buffer is equal to or smaller than the calculated minimum size—i.e. when the average overflow size is zero or negative.

The overflow detection timer is arranged to trigger the second-stage CMP triggering timer to start when the overflow size of the jitter buffer exceeds some predefined level. This avoids compression being triggered by small fluctuations in the size of the jitter buffer.

The CMP triggering timer increments in the same manner as the overflow detection timer: when the average overflow size is greater than zero, the timer increments from a starting point of zero on each play request being received at the PMC. The timer is incremented by the size of the play request received, or by some other suitable metric. The CMP triggering timer is arranged to trigger when it reaches an adaptive threshold $T_3$ which can be selected in dependence on the overflow size. For example:

$$T_3 = \begin{cases} 2*(\text{minimum of } T_4 \text{ and } 2^k \; of_{ms}(k)) \text{ when} \\ \quad of_{ms}(k) > 10 \text{ ms and } jb_{ms}^e(k) \leq 10 \\ \text{minimum of } T_4 \text{ and } 2^k \; of_{ms}(k) \text{ otherwise} \end{cases}$$

Suitable values for $T_4$ can be around 3500 ms for a packet size of 20 ms.

The adaptive threshold can be recalculated on each play request being received so as to constantly adapt the threshold in dependence on the overflow size. By arranging that the adaptive threshold is capped at $T_3$, the threshold can increase as the overflow size increases at smaller values of threshold overflow, but the threshold does not exceed the cap so as to ensure that the PMC can rapidly respond to large overflow values.

Once the CMP triggering timer reaches its threshold (whether adaptive or otherwise), compression of the samples carried in the data packets at the jitter buffer can be performed. This can be achieved by configuring the PMC 105 to generate a CMP packet for indicating to the decoder 104 that compression by a certain length of samples (e.g. a certain number of milliseconds is required). The decoder can be configured to perform such compression according to any suitable compression technique. The PMC can be configured to cause compression by some proportion of the buffer overflow size. For example, the PMC can be configured to generate CMP packets each requesting compression by 25% of the overflow size, 20% of the overflow size, 30% of the overflow size, or 35% of the overflow size. The particular choice of the amount of compression to perform by each compression operation can depend on the characteristics of the particular compression mechanisms performed by the decoder.

Following the generation of each CMP packet, the CMP triggering timer (and potentially the overflow detection timer) can be reset to zero. This ensures that compression operations are only performed when both timers indicate that compression is required.

It will be appreciated that other examples are possible which utilise only a single timer to trigger compression. For example, a single timer with an adaptive threshold in the manner described above.

Performance

Figure 4:
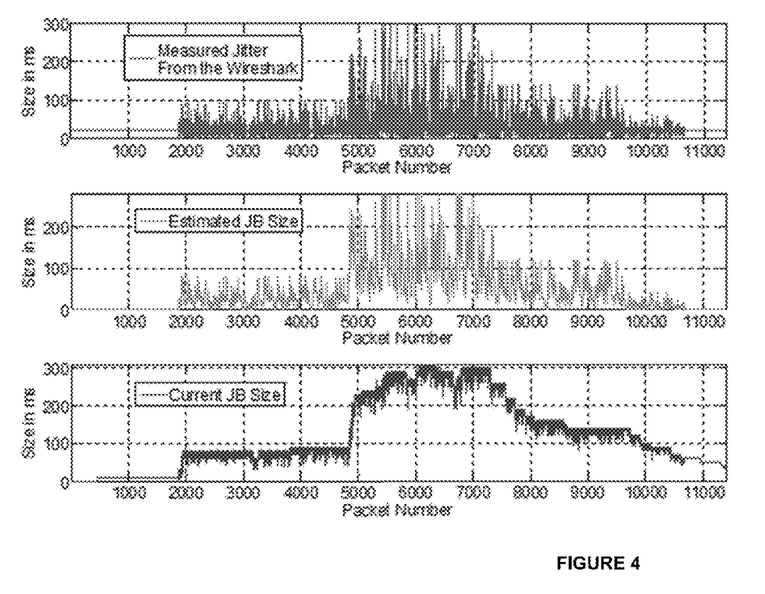
FIG. 4 illustrates the performance of the data processing device operating on a simulated network.

The performance of a data processing device configured in the manner described herein is illustrated in the plots shown in FIG. 4. The plots relate to a data processing device implemented as a VoIP endpoint and supporting a VoIP communication link over a network simulated using NistNet and the Linux TC network simulator. Network parameters such as packet loss, network jitter and delay have been used from widely accepted statistical models.

FIG. 4 shows the jitter tracking behavior of the data processing device as the simulated network jitter is varied. It can be seen from the figure that the data processing device closely estimates the jitter applied and correspondingly changes the buffer size to store the out of order packets. This provides smooth voice quality with optimum end to end delay for the VoIP link.

The data processing device of FIG. 1 and the frame processor of FIG. 3 are shown as comprising a number of functional blocks. This is for illustrative purposes only and is not intended to define a strict division between different parts of hardware on a chip or between different programs, procedures or functions in software. The term logic as used herein can refer to any kind of software, hardware, or combination of hardware and software.

Data processing devices configured in accordance with the present invention could be embodied in hardware, software or any suitable combination of hardware and software. A data processing device of the present invention could comprise, for example, software for execution at one or more processors (such as at a CPU and/or GPU), and/or one or more dedicated processors (such as ASICs), and/or one or more programmable processors (such as FPGAs) suitably programmed so as to provide functionalities of the data processing device, and/or heterogeneous processors comprising one or more dedicated, programmable and general purpose processing functionalities. In preferred embodiments of the present invention, the data processing device comprises one or more processors and one or more memories having program code stored thereon, the data processors and the memories being such as to, in combination, provide the claimed data processing device and/or perform the claimed methods.

The term software as used herein includes executable code for processors (e.g. CPUs and/or GPUs), firmware, bytecode, programming language code such as C or OpenCL, and modules for reconfigurable logic devices such as FPGAs. Machine-readable code includes software and code for defining hardware, such as register transfer level (RTL) code as might be generated in Verilog or VHDL.

Any one or more of the algorithms and methods described herein could be performed by one or more physical processing units executing program code that causes the unit(s) to perform the algorithms/methods. The or each physical processing unit could be any suitable processor, such as a CPU or GPU (or a core thereof), or fixed function or programmable hardware. The program code could be stored in non-transitory form at a machine readable medium such as an integrated circuit memory, or optical or magnetic storage. A machine readable medium might comprise several memories, such as on-chip memories, computer working memories, and non-volatile storage devices.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A data processing device comprising:
 a jitter buffer configured to receive data packets;
 a media decoder configured to decode data packets from the jitter buffer so as to form a stream of media frames, each media frame comprising a plurality of samples;
 a media consumer having an input buffer for receiving the stream of media frames and being configured to play media frames from the input buffer according to a first frame rate;
 a buffer interface configured to monitor the input buffer so as to detect when a number of samples at the input buffer of the media consumer falls below a predetermined level and, in response, generate a play-out request; and
 a media controller configured to, in response to the play-out request:
  estimate a timestamp of a next data packet to be played out from the jitter buffer based on a preceding data packet played out from the jitter buffer;
  search the jitter buffer for a best match data packet having a timestamp in accordance with the estimated timestamp; and
  transfer the best match data packet to the media decoder so as to cause the stream of media frames to be delivered into the input buffer at a rate commensurate with the first frame rate.

2. The data processing device as claimed in claim 1, wherein the predetermined level is at least the number of samples comprised in a media frame.

3. The data processing device as claimed in claim 1, the buffer interface being configured to periodically check the number of samples at the input buffer at a rate commensurate with the first frame rate.

4. The data processing device as claimed in claim 1, further comprising a receive queue for receiving data packets from a network, the media controller being configured to periodically store in the jitter buffer all of the data packets available at the receive queue whose timestamps are greater than a timestamp of a last data packet transferred by the media controller.

5. The data processing device as claimed in claim 1, wherein the media controller is further configured to maintain a histogram representing a distribution of time periods between timestamps of successive data packets stored at the jitter buffer, the histogram indicating for each of a predetermined range of time periods a measure of the number of successive data packets separated by that time period.

6. The data processing device as claimed in claim 1, wherein the media controller is further configured to estimate a minimum size for the jitter buffer by identifying a lowest time period between the timestamps of successive data packets for which a measure of a number of successive data packets separated by that time period is zero.

7. The data processing device as claimed in claim 6, wherein the media controller is further configured to cause the size of the jitter buffer to adapt so as to be at least the estimated minimum size.

8. The data processing device as claimed in claim 1, wherein the media controller is further configured to, in response to the play-out requests, estimate the timestamp of the next data packet to be transferred from the jitter buffer based on the timestamp of the preceding data packet transferred from the jitter buffer and the size of that preceding data packet.

9. The data processing device as claimed in claim 8, wherein the media controller is further configured to search the jitter buffer for a data packet having a lowest timestamp and, if that lowest timestamp is not equal to the timestamp of the best match data packet, discard the data packet having that lowest timestamp.

10. The data processing device as claimed in claim 8, wherein the media controller is further configured to, if the size of the jitter buffer was zero on a preceding play-out request being received, send to the media decoder a synthetic data packet selected in accordance with a time scale modification algorithm and irrespective of a presence or otherwise of a best match data packet.

11. The data processing device as claimed in claim 8, wherein the media controller is further configured to, if the best match data packet is not identified, transfer from the jitter buffer to the media decoder:

if the lowest timestamp is lower than the timestamp of the latest data packet transferred by the media controller, the data packet having the lowest timestamp provided that the latest data packet transferred by the media controller was at least one of a DTX, LOST, EXP, or DTMF data packet, and otherwise discard the data packet having the lowest timestamp and transfer an EXP data packet from the jitter buffer to the media decoder; and if the lowest timestamp is greater than the timestamp of the latest data packet transferred by the media controller, select a synthetic data packet in accordance with a time scale modification algorithm from the jitter buffer to the media decoder.

12. The data processing device as claimed in claim 8, wherein the media controller is further configured to, on each data packet being transferred from the jitter buffer, iteratively search for each next best match data packet until an amount of data has been transferred to the decoder to satisfy a number of samples indicated in or represented by the play-out request.

13. The data processing device as claimed in claim 1, wherein the media controller is further configured to identify as the best match data packet a data packet having a timestamp equal to the estimated timestamp or within the size of one media frame of the estimated timestamp according to a codec in use at the decoder, and decrease the size of the jitter buffer by the size of the best match data packet.

14. The data processing device as claimed in claim 1, wherein the media controller is further configured to, on storing a data packet whose timestamp precedes the timestamp of the latest transferred data packet by less than the size of the data packet, store only that part of the data packet representing media samples subsequent to the timestamp of the latest transferred data packet, and discarding that part of the data packet representing media samples preceding the timestamp of the latest transferred data packet.

15. The data processing device as claimed in claim 1, further comprising a first timer, wherein the media controller is further configured to, on receiving the play-out request, calculate an overflow size of the jitter buffer and to:

if the overflow size of the jitter buffer exceeds a first threshold, increment the first timer by a measure of the number of samples requested in the play-out request; and otherwise, reset the first timer to zero.

16. The data processing device as claimed in claim 15, wherein the media controller is further configured to, when the first timer exceeds a second threshold, generate one or more data packets so as to cause the decoder to perform compression by an amount selected in dependence on the overflow size.

17. The data processing device as claimed in claim 15, further comprising a second timer, wherein the media controller is further configured to, when the first timer exceeds a third threshold:

if the overflow size of the jitter buffer exceeds the first threshold, increment the second timer by a measure of the number of samples requested in the play-out request; and otherwise, not increment the second timer.

18. The data processing device as claimed in claim 17, wherein the media controller is further configured to, when the second timer exceeds a fourth threshold, reset the second timer to zero and generate one or more data packets so as to cause the decoder to perform compression by an amount selected in dependence on the overflow size.

19. The data processing device as claimed in claim 15, wherein the media controller is further configured to search the jitter buffer for the data packet having the lowest timestamp and, if that lowest timestamp is not equal to the timestamp of the best match data packet, discard the data packet having that lowest timestamp, wherein the overflow size is the difference between a measure of the size of the jitter buffer on receiving the play-out request and the estimated minimum size of the jitter buffer.

20. A method for controlling a stream of media frames to be transferred by a media consumer, the media consumer having an input buffer for receiving media frames decoded from a stream of data packets received over a network and being configured to play the media frames according to a first frame rate, the method comprising:

receiving data packets into a jitter buffer;

generating a play-out request by a buffer interface when a number of samples comprised in the media frames at the input buffer of the media consumer falls below a predetermined level;

responsive to the play-out requests:

estimating a timestamp of a next data packet to be played out from the jitter buffer based on a preceding data packet played out from the jitter buffer;

searching the jitter buffer for a best match data packet having a timestamp in accordance with the estimated timestamp; and if such a best match data packet is identified, transferring the best match data packet to a media decoder so as to cause media frames decoded from the transferred best match data packet to be delivered into the input buffer at a rate commensurate with the first frame rate.

* * * * *